(12) United States Patent
Kurokawa et al.

(10) Patent No.: US 9,111,836 B2
(45) Date of Patent: Aug. 18, 2015

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Yoshiyuki Kurokawa, Sagamihara (JP); Takayuki Ikeda, Atsugi (JP); Munehiro Kozuma, Isehara (JP); Takeshi Aoki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/583,363

(22) Filed: Dec. 26, 2014

(65) Prior Publication Data

US 2015/0108556 A1    Apr. 23, 2015

Related U.S. Application Data

(63) Continuation of application No. 13/037,491, filed on Mar. 1, 2011, now Pat. No. 8,976,155.

(30) Foreign Application Priority Data

Mar. 8, 2010   (JP) ................................ 2010-050776

(51) Int. Cl.
    *H01L 27/146*       (2006.01)
(52) U.S. Cl.
    CPC ................................ *H01L 27/14643* (2013.01)
(58) Field of Classification Search
    CPC ............ G09G 1/143; G09G 2320/041; G09G 3/3233; G09G 3/3241
    USPC .............. 345/207, 173, 81; 178/18.09, 19.05; 257/59
    See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101366120 A | 2/2009 |
| EP | 1122792 A | 8/2001 |

(Continued)

OTHER PUBLICATIONS

Chinese Office Action (Application No. 201180012776.X) Dated Jan. 7, 2015.

(Continued)

*Primary Examiner* — Shaheda Abdin
(74) *Attorney, Agent, or Firm* — Eric J. Robinson; Robinson Intellectual Property Law Office, P.C.

(57) ABSTRACT

A semiconductor device includes a photodiode, a first transistor, a second transistor, and a third transistor. The second transistor and the third transistor have a function of retaining a charge accumulated in a gate of the first transistor. In a period during which the second transistor and the third transistor are off, a voltage level of a voltage applied to a gate of the second transistor is set to be lower than a voltage level of a source of the second transistor and a voltage level of a drain of the second transistor, and a voltage level of a voltage applied to a gate of the third transistor is set to be lower than a voltage level of a source of the third transistor and a voltage level of a drain of the third transistor.

17 Claims, 10 Drawing Sheets

(56) References Cited

U.S. PATENT DOCUMENTS

| | | |
|---|---|---|
| 6,294,274 B1 | 9/2001 | Kawazoe et al. |
| 6,433,373 B1 | 8/2002 | Lee et al. |
| 6,563,174 B2 | 5/2003 | Kawasaki et al. |
| 6,610,557 B2 | 8/2003 | Lee et al. |
| 6,727,522 B1 | 4/2004 | Kawasaki et al. |
| 6,747,638 B2 | 6/2004 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,271,835 B2 | 9/2007 | Iizuka et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,483,005 B2 | 1/2009 | Nakamura et al. |
| 7,501,293 B2 | 3/2009 | Ito et al. |
| 7,525,523 B2 | 4/2009 | Yamazaki et al. |
| 7,612,320 B2 | 11/2009 | Hagihara |
| 7,626,625 B2 | 12/2009 | Nomoto et al. |
| 7,649,561 B2 | 1/2010 | Mabuchi |
| 7,663,165 B2 | 2/2010 | Mouli |
| 7,674,650 B2 | 3/2010 | Akimoto et al. |
| 7,709,777 B2 | 5/2010 | Rhodes |
| 7,732,819 B2 | 6/2010 | Akimoto et al. |
| 8,004,591 B2 | 8/2011 | Mabuchi |
| 8,675,108 B2 | 3/2014 | Mabuchi |
| 2001/0046027 A1 | 11/2001 | Tai et al. |
| 2002/0011972 A1 | 1/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051801 A1 | 3/2004 | Iizuka et al. |
| 2004/0127038 A1 | 7/2004 | Carcia et al. |
| 2004/0217928 A1 | 11/2004 | Yamazaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0157760 A1 | 7/2006 | Hayashi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024726 A1* | 2/2007 | Nomoto et al. ............... 348/308 |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197269 A1 | 8/2008 | Hagihara |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1* | 12/2008 | Akimoto et al. ................ 257/59 |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2010/0065844 A1 | 3/2010 | Tokunaga |
| 2010/0073536 A1 | 3/2010 | Nomoto et al. |
| 2010/0092800 A1 | 4/2010 | Itagaki et al. |
| 2010/0109002 A1 | 5/2010 | Itagaki et al. |
| 2010/0258709 A1 | 10/2010 | Rhodes |

FOREIGN PATENT DOCUMENTS

| | | |
|---|---|---|
| EP | 1667440 A | 6/2006 |
| EP | 1737044 A | 12/2006 |
| EP | 1781016 A | 5/2007 |
| EP | 2226847 A | 9/2010 |
| EP | 2244455 A | 10/2010 |
| EP | 1677514 B | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-292276 A | 10/2001 |
| JP | 2002-016243 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-094240 A | 4/2005 |
| JP | 2005-134809 A | 5/2005 |
| JP | 2006-527973 | 12/2006 |
| JP | 2007-129288 A | 5/2007 |
| JP | 2008-205891 A | 9/2008 |
| JP | 2009-105381 A | 5/2009 |

(56) References Cited

FOREIGN PATENT DOCUMENTS

| | | |
|---|---|---|
| JP | 2009-535819 | 10/2009 |
| WO | WO-2004/114391 | 12/2004 |
| WO | WO-2004/114652 | 12/2004 |
| WO | WO-2008/027392 | 3/2008 |

OTHER PUBLICATIONS

International Search Report (Application No. PCT/JP2011/053312) Dated Mar. 22, 2011.

Written Opinion (Application No. PCT/JP2011/053312) Dated Mar. 22, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A. (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 850-863.

Nomura.K et al., "Room-Temperature Fabrication of Transparent Flexible Thin-Film Transistors Using Amorphous Oxide Semiconductors", Nature, Nov. 25, 2004, vol. 432. pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID DIGEST '07 : SID International Symposium Digest of Technical Papers, 2007, vol. 38, pp. 1830-1833.

Hirao.T et al., "Novel Top-Gate Zinc Oxide Thin-Film Transistors (ZNO TFTs) for AMLCDs", J. Soc. Inf. Display (Journal of the Society For Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al, "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID

(56) References Cited

OTHER PUBLICATIONS

Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", Non-cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B. (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosphical Magazine, 2001, vol. 81, No. 5, pp. 501-515.
Janotti.A et al., "Oxygen Cacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide-Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B) Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

US 9,111,836 B2

SEMICONDUCTOR DEVICE AND DRIVING METHOD THEREOF

TECHNICAL FIELD

The technical field relates to a photosensor and a driving method thereof. The technical field also relates to a display device including a photosensor and a driving method thereof. Further, the technical field relates to a semiconductor device including a photosensor and a driving method thereof.

BACKGROUND ART

In recent years, a display device provided with a light-detecting sensor (also referred to as a "photosensor") has attracted attention. In the display device including a photosensor, a display screen also serves as an input region. A display device having an image capturing function is an example of such a display device (see Patent Document 1, for example).

Examples of a semiconductor device provided with a photosensor are a CCD image sensor and a CMOS image sensor. Such image sensors are used in, for example, electronic apparatuses like digital still cameras or cellular phones.

In a display device provided with a photosensor, first, light is emitted from the display device. When the light enters a region where an object to be detected exists, the light is blocked by the object to be detected, and is partly reflected. The light reflected by the object to be detected is detected by the photosensor provided in a pixel in the display device, whereby the object to be detected can be found in the region.

In a semiconductor device including a photosensor, light emitted from an object to be detected or external light reflected by the object to be detected is detected directly by the photosensor or condensed by an optical lens or the like and then detected.

REFERENCE

[Patent Document 1] Japanese Published Patent Application No. 2001-292276

DISCLOSURE OF INVENTION

In a semiconductor device including photosensors, each pixel is provided with a circuit including a transistor so as to collect electric signals generated by detection of light with the photosensors provided in the respective pixels.

However, it is difficult to accurately convert incident light into an electric signal because of variation in the electrical characteristics such as threshold voltage of a transistor provided in each pixel.

An object of one embodiment of the present invention is to provide a semiconductor device including a photosensor in which incident light can be accurately converted into an electric signal.

One embodiment of the present invention is a semiconductor device including a photodiode, a first transistor, a second transistor, a third transistor, and a fourth transistor. The photodiode has a function of supplying a charge corresponding to incident light to a gate of the first transistor through the second transistor. The first transistor has a function of accumulating the charge supplied to the gate and a function of converting the accumulated charge into an output signal. The second transistor has a function of retaining the charge accumulated in the gate of the first transistor. The third transistor has a function of discharging the charge accumulated in the gate of the first transistor and a function of retaining the charge accumulated in the gate of the first transistor. The fourth transistor has a function of controlling reading of the output signal. In a period during which the second transistor and the third transistor are off, a voltage level of a voltage applied to a gate of the second transistor is lower than a voltage level of a source of the second transistor and a voltage level of a drain of the second transistor, and a voltage level of a voltage applied to a gate of the third transistor is lower than a voltage level of a source of the third transistor and a voltage level of a drain of the third transistor.

Another embodiment of the present invention is a semiconductor device including a photodiode, a first transistor, a second transistor, a third transistor, and a fourth transistor. The photodiode has a function of supplying a charge corresponding to incident light to a gate of the first transistor through the second transistor. The first transistor has a function of accumulating the charge supplied to the gate and a function of converting the accumulated charge into an output signal. The second transistor has a function of retaining the charge accumulated in the gate of the first transistor. The third transistor has a function of discharging the charge accumulated in the gate of the first transistor. The fourth transistor has a function of controlling reading of the output signal. In a period during which the second transistor and the third transistor are off, a voltage level of a voltage applied to a gate of the second transistor is lower than a voltage level of a wiring electrically connected to the photodiode, and a voltage level of a voltage applied to a gate of the third transistor is lower than a voltage level of a photosensor reference signal line.

Another embodiment of the present invention is a semiconductor device including a photodiode, a first transistor, a second transistor, a third transistor, and a fourth transistor. The photodiode has a function of supplying a charge corresponding to incident light to a gate of the first transistor through the second transistor. The first transistor has a function of accumulating the charge supplied to the gate and a function of converting the accumulated charge into an output signal. The second transistor has a function of retaining the charge accumulated in the gate of the first transistor. The third transistor has a function of discharging the charge accumulated in the gate of the first transistor and a function of retaining the charge accumulated in the gate of the first transistor. The fourth transistor has a function of controlling reading of the output signal. A semiconductor layer of the second transistor and a semiconductor layer of the third transistor which are electrically connected to the gate of the first transistor include an oxide semiconductor. In a period during which the second transistor and the third transistor are off, a voltage level of a voltage applied to a gate of the second transistor is lower than a voltage level on a low voltage side of a source and a drain of the second transistor, and a voltage level of a voltage applied to a gate of the third transistor is lower than a voltage level on a low voltage side of a source and a drain of the third transistor.

Another embodiment of the present invention is a semiconductor device including a photodiode, a first transistor, a second transistor, a third transistor, and a fourth transistor. The photodiode has a function of supplying a charge corresponding to incident light to a gate of the first transistor through the second transistor. The first transistor has a function of accumulating the charge supplied to the gate and a function of converting the accumulated charge into an output signal. The second transistor has a function of retaining the charge accumulated in the gate of the first transistor. The third transistor has a function of discharging the charge accumulated in the gate of the first transistor. The fourth transistor has a function of controlling reading of the output signal. A semiconductor layer of the second transistor and a semiconductor layer of the third transistor which are electrically connected to the gate of the first transistor include an oxide semiconductor. In a period during which the second transistor and the third transistor are off, a voltage level of a voltage applied to a gate of the second transistor is lower than a voltage level of a wiring electrically connected to the photodiode, and a voltage level of a voltage applied to a gate of the third transistor is lower than a voltage level of a photosensor reference signal line.

Note that the semiconductor device refers to an element having a semiconductor property, and all the objects having the element. For example, a display device having a transistor is simply referred to as a semiconductor device in some cases.

A semiconductor device including a photosensor in which incident light can be accurately converted into an electric signal can be provided.

In addition, since accumulation operation is simultaneously performed in the plurality of photosensors, the accumulation operation can be completed in a short time, so that an image of an object to be detected can be taken with little blur even when the object moves fast.

Furthermore, a transistor controlling the accumulation operation includes an oxide semiconductor and thus has an extremely low off-current. Consequently, incident light can be accurately converted into an electric signal even when the number of photosensors increases and selection operation requires longer time. Thus, an image with high resolution can be taken.

BEST MODE FOR CARRYING OUT THE INVENTION

Figure 1:
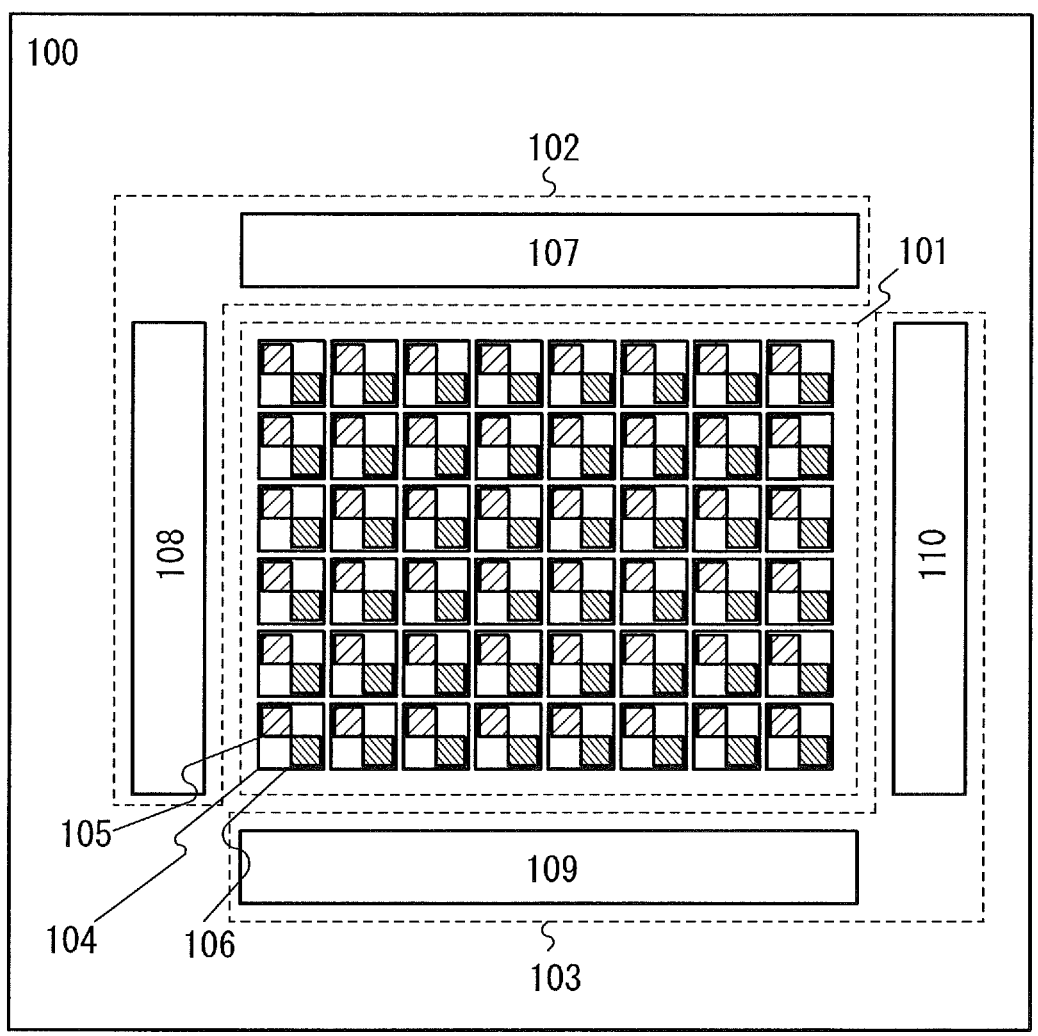
FIG. 1 illustrates an example of a display device according to one embodiment of the present invention.

Embodiments will be described in detail below with reference to drawings. Note that the following embodiments can be implemented in many different modes, and it is apparent to those skilled in the art that modes and details can be modified in various ways without departing from the spirit and scope of the present invention. Therefore, the present invention is not construed as being limited to the description of the embodiments. Note that in all the drawings for explaining the embodiments, like portions or portions having a similar function are denoted by like reference numerals, and the description thereof is omitted.

Embodiment 1

In this embodiment, a structure of a display device which is a semiconductor device including a photosensor and operation thereof will be described with reference to FIG. 1, FIG. 2, and FIG. 3. Note that the display device including a photosensor can be used as an optical touch sensor.

A structure of the display device will be described with reference to FIG. 1. A display panel 100 includes a pixel circuit 101, a display element control circuit 102, and a photosensor control circuit 103.

The pixel circuit 101 includes a plurality of pixels 104 arranged in matrix in a row direction and a column direction. Each of the pixels 104 includes a display element 105 and a photosensor 106. The photosensor is not necessarily provided in each of the pixels 104, and may be provided in every two or more pixels 104. Alternatively, the photosensor may be provided outside the pixels 104.

A circuit diagram of the pixel 104 will be described with reference to FIG. 2. The pixel 104 includes the display element 105 provided with a transistor 201 (also referred to as a pixel transistor), a storage capacitor 202, and a liquid crystal element 203; and the photosensor 106 provided with a photodiode 204 which is a light-receiving element, a transistor 205 (also referred to as a first transistor), a transistor 206 (also referred to as a second transistor), a transistor 207 (also referred to as a third transistor), and a transistor 208 (also referred to as a fourth transistor).

In the display element 105, a gate of the transistor 201 is connected to a gate signal line 209, one of a source and a drain of the transistor 201 is connected to a video data signal line 210, and the other of the source and the drain is connected to one electrode of the storage capacitor 202 and one electrode of the liquid crystal element 203. The other electrode of the storage capacitor 202 and the other electrode of the liquid crystal element 203 are each kept at a constant voltage level. The liquid crystal element 203 is an element including a pair of electrodes and a liquid crystal layer interposed between the pair of electrodes.

Note that when it is explicitly described that "A and B are connected", the case where A and B are electrically connected, the case where A and B are functionally connected, and the case where A and B are directly connected are included therein.

The transistor 201 has a function of controlling injection or release of charges to or from the storage capacitor 202. For example, when a high-level voltage is applied to the gate signal line 209, a voltage at the voltage level of the video data signal line 210 is applied to the storage capacitor 202 and the liquid crystal element 203. The storage capacitor 202 has a function of retaining a charge corresponding to a voltage applied to the liquid crystal element 203. The contrast (gray scale) of light passing through the liquid crystal element 203 is made by utilizing the change in the polarization direction due to voltage application to the liquid crystal element 203, whereby image display is realized. As the light passing through the liquid crystal element 203, light emitted from a light source (a backlight) on the back surface of the display device is used.

For the transistor 201, an amorphous semiconductor, a microcrystal semiconductor, a polycrystalline semiconductor, an oxide semiconductor, a single crystal semiconductor, or the like can be used. In particular, display quality can be increased by using an oxide semiconductor to obtain a transistor with an extremely low off-current.

Although the display element 105 described here includes the liquid crystal element, the display element 105 may include other elements such as a light-emitting element. The light-emitting element is an element whose luminance is controlled with current or voltage, and specific examples thereof are a light-emitting diode and an organic light-emitting diode (OLED). Note that in this embodiment, a structure of an optical touch sensor (also referred to as an optical touch panel) provided with the display element 105 and the photosensor 106 is described; however, a structure in which a display element is eliminated can also be employed. In that case, an image sensor in which a plurality of photosensors is provided can be obtained.

In the photosensor 106, one electrode of the photodiode 204 is connected to a wiring 211 (also referred to as a ground line), and the other electrode thereof is connected to one of a source and a drain of the transistor 206. One of a source and a drain of the transistor 205 is connected to a photosensor reference signal line 212, and the other of the source and the drain is connected to one of a source and a drain of the transistor 208. A gate of the transistor 206 is connected to a gate signal line 213, and the other of the source and the drain of the transistor 206 is connected to a gate of the transistor 205 and one of a source and a drain of the transistor 207. A gate of the transistor 207 is connected to a photodiode reset signal line 214, and the other of the source and the drain of the transistor 207 is connected to the photosensor reference signal line 212. A gate of the transistor 208 is connected to a gate signal line 215, and the other of the source and the drain of the transistor 208 is connected to a photosensor output signal line 216.

For the photodiode 204, an amorphous semiconductor, a microcrystal semiconductor, a polycrystalline semiconductor, an oxide semiconductor, a single crystal semiconductor, or the like can be used. In particular, a single crystal semiconductor (e.g., single crystal silicon) with few crystal defects is preferably used so as to improve the proportion of an electric signal generated from incident light (the quantum efficiency). As the semiconductor material, it is preferable to use silicon semiconductor such as silicon or silicon germanium, the crystallinity of which can be easily increased.

For the transistor 205, an amorphous semiconductor, a microcrystal semiconductor, a polycrystalline semiconductor, an oxide semiconductor, a single crystal semiconductor, or the like can be used. In particular, the transistor 205 has a function of accumulating a charge which is supplied from the photodiode 204 through the transistor 206, in a node connected to the gate and converting the accumulated charge into an output signal. Therefore, a single crystal semiconductor is preferably used to obtain a transistor with high mobility. As the semiconductor material, it is preferable to use silicon semiconductor such as silicon or silicon germanium, the crystallinity of which can be easily increased.

For the transistor 206, an amorphous semiconductor, a microcrystal semiconductor, a polycrystalline semiconductor, an oxide semiconductor, a single crystal semiconductor, or the like can be used. In particular, the transistor 206 has a function of retaining a charge of the gate of the transistor 205 by controlling on/off of the transistor 206. Therefore, the transistor 206 preferably uses an oxide semiconductor to have an extremely low off-current.

For the transistor 207, an amorphous semiconductor, a microcrystal semiconductor, a polycrystalline semiconductor, an oxide semiconductor, a single crystal semiconductor, or the like can be used. In particular, the transistor 207 has a function of discharging a charge of the gate of the transistor 205 and a function of retaining a charge of the gate of the transistor 205, by controlling on/off of the transistor 207. Therefore, the transistor 207 preferably uses an oxide semiconductor to have an extremely low off-current.

For the transistor 208, an amorphous semiconductor, a microcrystal semiconductor, a polycrystalline semiconductor, an oxide semiconductor, a single crystal semiconductor, or the like can be used. In particular, a single crystal semiconductor is preferably used for the transistor 208 so that the transistor 208 has high mobility and has a function of supplying an output signal of the transistor 205 to the photosensor output signal line 216. As the semiconductor material, it is preferable to use silicon semiconductor such as silicon or silicon germanium, the crystallinity of which can be easily increased.

The display element control circuit 102 is a circuit for controlling the display element 105, and includes a display element driver circuit 107 from which a signal is input to the display element 105 through a signal line (also referred to as a source signal line) such as the video data signal line; and a display element driver circuit 108 from which a signal is input to the display element 105 through a scan line (also referred to as a gate signal line). For example, the display element driver circuit 108 on the scan line side has a function of selecting a display element included in a pixel in a specified row. The display element driver circuit 107 on the signal line side has a function of supplying a predetermined-level voltage to the display element included in the pixel in the selected row. Note that in the display element 105 connected to the gate signal line to which a high-level voltage is applied from the display element driver circuit 108 on the scan line side, the transistor is turned on and supplied with a voltage at the same level as the voltage applied to the video data signal line from the display element driver circuit 107 on the signal line side.

The photosensor control circuit 103 is a circuit for controlling the photosensor 106, and includes a photosensor reading circuit 109 on the signal line side, where the signal line includes such as the photosensor output signal line or the photosensor reference signal line; and a photosensor driver circuit 110 on the scan line side.

The photosensor driver circuit 110 has a function of performing the hereinafter described reset operation, accumulation operation, and selection operation on the photosensor 106 included in a pixel in a specified row.

The photosensor reading circuit 109 has a function of extracting an output signal of the photosensor 106 included in a pixel in a selected row. Note that from the photosensor reading circuit 109, an output of the photosensor 106, which is an analog signal, is extracted as it is to the outside of the display panel with the use of an OP amplifier. Alternatively, the output of the photosensor 106 is converted into a digital signal with the use of an A/D converter circuit and then extracted to the outside of the display panel.

A precharge circuit included in the photosensor reading circuit 109 will be described with reference to FIG. 2. In FIG. 2, a precharge circuit 200 for one column of pixels includes a transistor 217 and a precharge signal line 218. Note that the photosensor reading circuit 109 can include an OP amplifier or an A/D converter circuit connected to a subsequent stage of the precharge circuit 200.

In the precharge circuit 200, before the operation of the photosensor in the pixel, the voltage level of the photosensor output signal line is set to a reference voltage level. In FIG. 2, the precharge signal line 218 is set to an H level (hereinafter, abbreviated to "H") so that the transistor 217 is turned on, whereby the voltage level of the photosensor output signal line 216 can be set to a reference voltage level (here, a low voltage level). Note that it is effective to provide a storage capacitor for the photosensor output signal line 216 so that the voltage level of the photosensor output signal line 216 is stabilized. Note that the reference voltage level can be set to a high voltage level. In that case, the conductivity type of the transistor 217 is made opposite to that of FIG. 2 and the precharge signal line 218 is set to an L level (hereinafter, abbreviated to "L"), whereby the voltage level of the photosensor output signal line 216 can be set to a reference voltage level.

Note that an H-level voltage and an L-level voltage in this embodiment correspond to a voltage which is based on a high power source voltage level and a voltage which is based on a low power source voltage level, respectively. In other words, the H-level voltage is a constant voltage of 3 V to 20 V, and the L-level voltage is a constant voltage of 0 V (also referred to as a reference voltage level or a ground voltage level).

Next, the operation of the photosensor 106 will be described with reference to the timing chart of FIG. 3. In FIG. 3, a signal 301, a signal 302, and a signal 303 respectively correspond to the voltage levels of the gate signal line 213, the reset signal line 214, and the gate signal line 215 in FIG. 2. Further, signals 304A to 304C each correspond to the voltage level of the gate of the transistor 205 (the voltage level of a node 219 in FIG. 2). The signal 304A shows the case where the illuminance of light which enters the photodiode 204 is high (hereinafter, high illuminance), the signal 304B shows the case where the illuminance of light which enters the photodiode 204 is middle (hereinafter, middle illuminance), and the signal 304C shows the case where the illuminance of light which enters the photodiode 204 is low (hereinafter, low illuminance). Further, the signals 305A to 305C each correspond to the voltage level of the photosensor output signal line 216, and the signals 305A to 305C show the high illuminance, the middle illuminance, and the low illuminance, respectively.

In a period A, the voltage level of the gate signal line 213 (the signal 301) is set to "H", the voltage level of the reset signal line 214 (the signal 302) is set to a level lower than 0 V (hereinafter, abbreviated to "L2"), and the voltage level of the gate signal line 215 (the signal 303) is set to "L". Next, in a period B, the voltage level of the gate signal line 213 (the signal 301) is set to "H", the voltage level of the reset signal line 214 (the signal 302) is set to "H", and the voltage level of the gate signal line 215 (the signal 303) is set to "L". As a result, the photodiode 204 and the transistor 206 are turned on, and the voltage level of the node 219 (the signals 304A to 304C) becomes "H". At this time, reverse bias is applied to the photodiode 204. Further, when the voltage level of the precharge signal line 218 is set to the H level, the voltage level of the photosensor output signal line 216 (the signals 305A to 305C) is precharged to "L". As described above, the period A and the period B are a reset operation period.

Note that in this specification, the level lower than 0 V means, specifically, a voltage level which is lower than the voltage level of the source of the transistor 206, the voltage level of the drain of the transistor 206, the voltage level of the source of the transistor 207, and the voltage level of the drain of the transistor 207. In this embodiment, the voltage level on the low voltage side of the sources and the drains of the transistors 206 and 207 is 0 V which is the voltage level of the ground line, and the voltage level of the gate signal line 213 and the voltage level of the reset signal line 214 in a predetermined period may be referred to as the level lower than 0 V. In other words, the voltage level on the low voltage side of the source and the drain of the transistor 206 and the voltage level on the low voltage side of the source and the drain of the transistor 207 can be respectively referred to as the voltage level of the wiring 211 connected to the photodiode 204 and the voltage level of the photosensor reference signal line 212, based on the circuit configuration illustrated in FIG. 2.

Next, in a period C, the voltage level of the gate signal line 213 (the signal 301) is set to "H", the voltage level of the reset signal line 214 (the signal 302) is set to "L2", and the voltage level of the gate signal line 215 (the signal 303) is set to "L". As a result, the voltage level of the node 219 (the signals 304A to 304C) starts to decrease with current due to light irradiation to the photodiode 204 (hereinafter, referred to as photocurrent). In the photodiode 204, photocurrent is increased with increase in the amount of incident light; accordingly, the voltage level of the node 219 (the signals 304A to 304C) changes in accordance with the amount of incident light. Specifically, since photocurrent is largely increased in the signal 304A having a large amount of incident light, the signal 304A which is the voltage level of the node 219 is largely decreased in the period C. Further, since photocurrent hardly flows in the signal 304C having a small amount of incident light, the signal 304C which is the voltage level of the node 219 hardly changes in the period C. Furthermore, since the amount of photocurrent is increased to an amount between the amount of the signal 304A and that of the signal 304C in the signal 304B having a middle amount of incident light, the amount of the signal 304B which is the voltage level of the node 219 is decreased to an amount between the decreased amount of the signal 304A and the decreased amount of the signal 304C. In other words, the photodiode 204 has a function of supplying a charge corresponding to the incident light to the gate of the transistor 205 through the transistor 206. Then, the channel resistance between the source and the drain of the transistor 205 changes. As described above, the period C is an accumulation operation period.

Next, in a period D, the voltage level of the gate signal line 213 (the signal 301) is set to "L2", the voltage level of the reset signal line 214 (the signal 302) is set to "L2", and the voltage level of the gate signal line 215 (the signal 303) is set to "L". The signals 304A to 304C which are the voltage level of the node 219 become constant. Here, the voltage levels of the signals 304A to 304C in the period D are determined by the amount of photocurrent of the photodiode 204 in the above-described accumulation operation period (the period C). That is, the amount of charge accumulated in the node 219 changes in accordance with the incident light to the photodiode 204. Note that an oxide semiconductor is used for a semiconductor layer of the transistor 206 and a semiconductor layer of the transistor 207 to obtain transistors with extremely low off-currents, whereby the accumulated charge can be kept constant until the subsequent selection operation is performed.

Next, in a period E, the voltage level of the gate signal line 213 (the signal 301) is set to "L2", the voltage level of the reset signal line 214 (the signal 302) is set to "L2", and the voltage level of the gate signal line 215 (the signal 303) is set to "H". As a result, the transistor 208 is turned on and the photosensor reference signal line 212 and the photosensor output signal line 216 are brought into electrical conduction through the transistors 205 and 208. Then, the voltage level of the photosensor output signal line 216 (the signals 305A to 305C) is increased in accordance with incident light to the above-described photodiode 204. Note that in a period before the period E, the voltage level of the precharge signal line 218 is set to "H" so that the precharge of the photosensor output signal line 216 is completed. Here, the rate at which the voltage level of the photosensor output signal line 216 (the signals 305A to 305C) is increased depends on the current between the source and the drain of the transistor 205, namely, the amount of incident light to the photodiode 204 during the period C which is the accumulation operation period. As described above, the period E is a selection operation period.

Next, in a period F, the voltage level of the gate signal line 213 (the signal 301) is set to "L2", the voltage level of the reset signal line 214 (the signal 302) is set to "L2", and the voltage level of the gate signal line 215 (the signal 303) is set to "L". As a result, the transistor 208 is turned off, and the voltage level of the photosensor output signal line 216 (the signals 305A to 305C) becomes constant. The constant value here is determined in accordance with the amount of incident light to the photodiode 204. Thus, the amount of incident light to the photodiode 204 during the accumulation operation can be determined by obtaining the voltage level of the photosensor output signal line 216. As described above, the period F is a reading operation period.

As described above, in the semiconductor device of this embodiment, the voltage level of the voltage applied to the gate of the transistor 206 and the voltage level of the voltage applied to the gate of the transistor 207 are set to lower than 0 V in the periods D, E, and F during which the transistor 206 is off and the periods A, D, E, and F during which the transistor 207 is off. In other words, the voltage level of the voltage applied between the gate and the source of the transistor 206 is set to a level of the threshold voltage of the transistor 206 or lower, and the voltage level of the voltage applied between the gate and the source of the transistor 207 is set to a level of the threshold voltage of the transistor 207 or lower. Thus, the function of retaining the charge retained in the gate of the transistor 205 can be improved.

More specifically, the operation of individual photosensors is realized by repeatedly performing the reset operation, the accumulation operation, the selection operation, and the reading operation. As described above, in this embodiment, the voltage level of the voltage applied to the gate of the transistor 206 and the voltage level of the voltage applied to the gate of the transistor 207 are lower than 0 V in a period during which the transistors 206 and 207 are off. Therefore, the transistors 206 and 207 can be turned off more reliably, which can improve the function of retaining the charge retained in the gate of the transistor 205 at the time of the accumulation operation and the reading operation. Further, the function of accurately converting the incident light into an electric signal in a photosensor can be improved. Furthermore, a semiconductor layer of the transistor 206 and a semiconductor layer of the transistor 207 preferably use an oxide semiconductor to obtain transistors having extremely low off-currents. With such a structure, the function of more accurately converting the incident light into an electric signal in a photosensor can be improved.

This embodiment can be combined with any of the other embodiments as appropriate.

Embodiment 2

In this embodiment, a method for driving a plurality of photosensors will be described.

Figure 4:
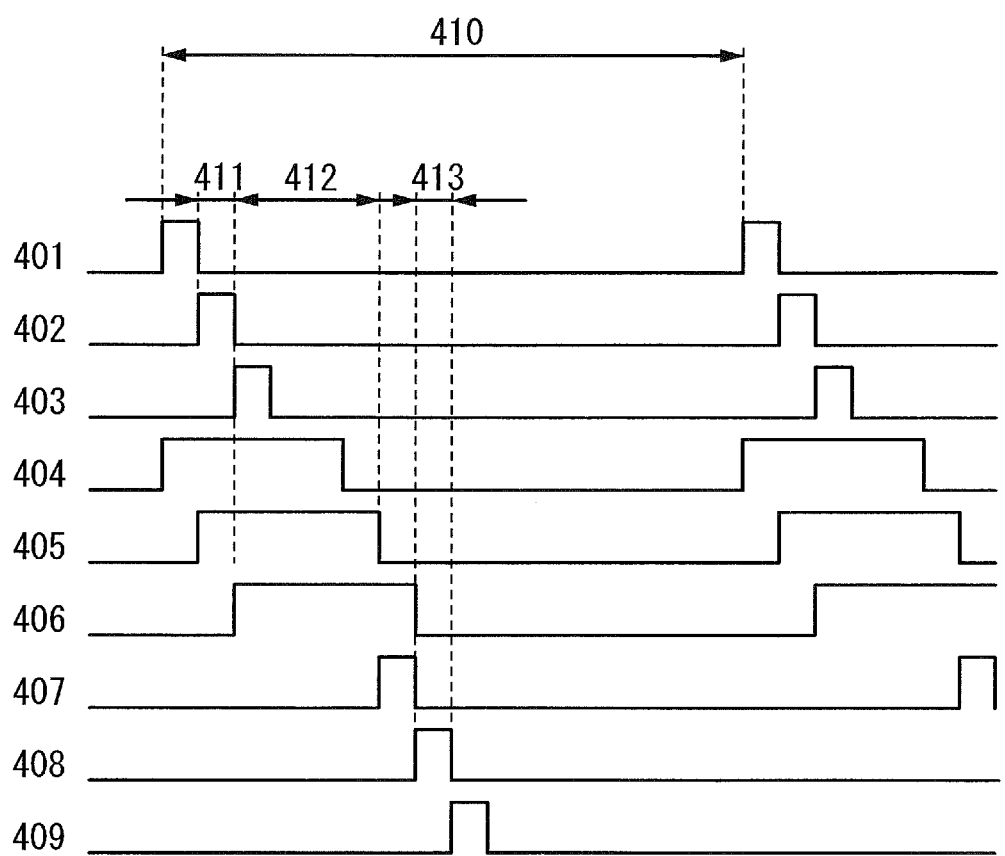
FIG. 4 is a timing chart according to one embodiment of the present invention.

First, a driving method illustrated in the timing chart of FIG. 4 is described. In FIG. 4, a signal 401, a signal 402, and a signal 403 are signals showing voltage changes of the reset signal lines 214 in photosensors of the first row, the second row, and the third row, respectively. A signal 404, a signal 405, and a signal 406 are signals showing voltage changes of the gate signal lines 213 in the photosensors of the first row, the second row, and the third row, respectively. A signal 407, a signal 408, and a signal 409 are signals showing voltage changes of the gate signal lines 215 in the photosensors of the first row, the second row, and the third row, respectively. A period 410 is a period required for one imaging. A period 411 is a period during which the reset operation is performed in the photosensor of the second row, a period 412 is a period during which the accumulation operation is performed in the photosensor of the second row, and a period 413 is a period during which the selection operation is performed in the photosensor of the second row. By thus sequentially driving the photosensor of each row, images can be taken.

It is found here that the accumulation operation in the photosensor of each row has a time lag. That is, imaging in the photosensor of each row is not performed simultaneously, leading to blurring of the image taken. In particular, an image of an object to be detected which moves fast is easily taken to have a distorted shape: if the object to be detected moves in a direction from the first row to the third row, an enlarged image is taken leaving a trail behind it; and if the object to be detected moves in the opposite direction, a reduced image is taken.

In order to prevent the time lag of the accumulation operation in the photosensor of each row, it is effective that the photosensor of each row is sequentially driven in a shorter cycle. In that case, however, the output signal of the photosensor needs to be obtained at very high speed with an OP amplifier or an A/D converter circuit, which causes an increase in power consumption, and makes it very difficult to obtain an image with high resolution, in particular.

Figure 5:
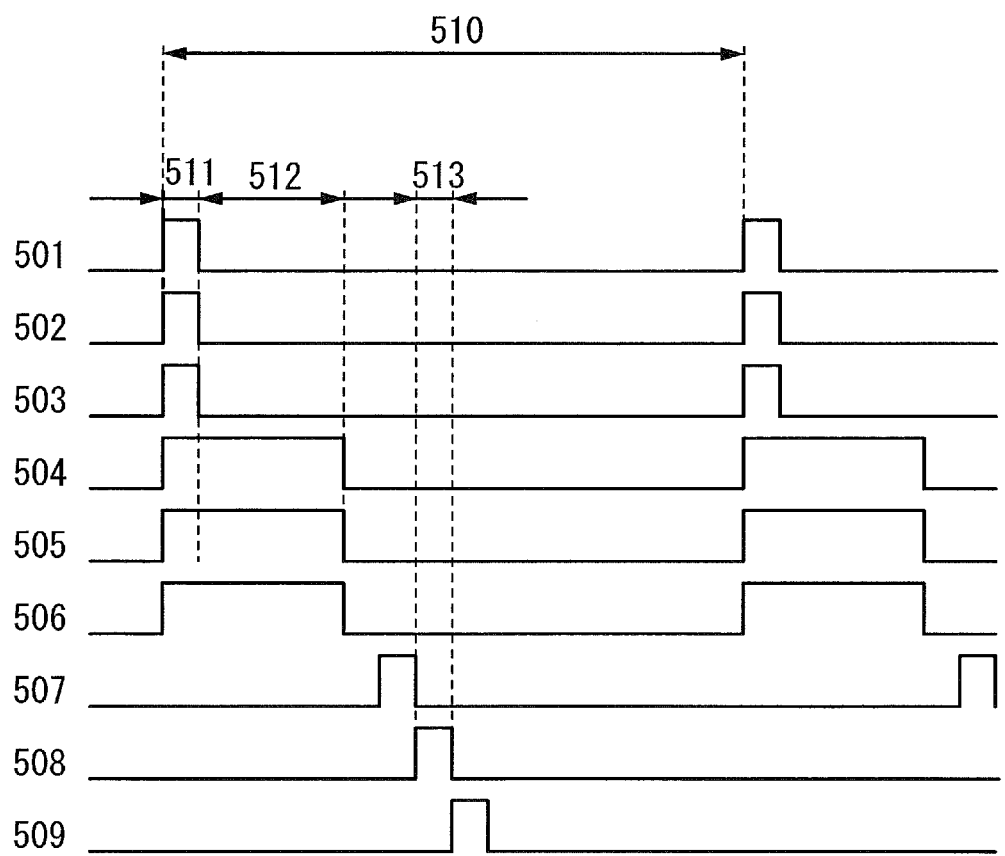
FIG. 5 is a timing chart according to one embodiment of the present invention.

Thus, a driving method illustrated in the timing chart of FIG. 5 is proposed. In FIG. 5, a signal 501, a signal 502, and a signal 503 are signals showing voltage changes of the reset signal lines 214 in the photosensors of the first row, the second row, and the third row, respectively. A signal 504, a signal 505, and a signal 506 are signals showing voltage changes of the gate signal lines 213 in the photosensors of the first row, the second row, and the third row, respectively. A signal 507, a signal 508, and a signal 509 are signals showing voltage changes of the gate signal lines 215 in the photosensors of the first row, the second row, and the third row, respectively. A period 510 is a period required for one imaging. A period 511 is a period during which the reset operation (at the same time in all the rows) is performed in the photosensor of the second row, a period 512 is a period during which the accumulation operation (at the same time in all the rows) is performed in the photosensor of the second row, and a period 513 is a period during which the selection operation is performed in the photosensor of the second row.

FIG. 5 is different from FIG. 4 in that the reset operation and the accumulation operation are each performed in the same period in the photosensors of all the rows, and after the accumulation operation, the selection operation is sequentially performed in each row without synchronization with the accumulation operation. When the accumulation operation is performed in the same period, imaging in the photosensor of each row is performed simultaneously and an image of an object to be detected can be easily taken with little blur even when the object moves fast. Since the accumulation operation is performed at the same time, a driver circuit can be provided in common for the reset signal line 214 of each photosensor. Further, a driver circuit can also be provided in common for the gate signal line 213 of each photosensor. Such driver circuits provided in common are effective in reducing the number of peripheral circuits or reducing power consumption. In addition, the selection operation sequentially performed in each row makes it possible to lower the operation rate of an OP amplifier or an A/D converter circuit when the output signal of the photosensor is obtained. At this time, the total time for the selection operation is preferably longer than the time for the accumulation operation, which is particularly effective in the case of obtaining an image with high resolution.

Note that FIG. 5 illustrates the timing chart of the method for sequentially driving the photosensor of each row; it is also effective to sequentially drive the photosensor only in a certain row in order to obtain an image in a specified region. As a result, a desired image can be obtained while the operation and power consumption of the OP amplifier or the A/D converter circuit are reduced. Further, a method for driving the photosensor of every few rows, namely, some of a plurality of photosensors, is also effective. As a result, an image with desired resolution can be obtained while the operation and power consumption of the OP amplifier or the A/D converter circuit are reduced.

In order to realize the above driving method, the voltage level of the gate of the transistor 205 in each photosensor needs to be kept constant even after the accumulation operation is completed. Thus, the transistor 207 preferably uses an oxide semiconductor to have an extremely low off-current as described in the above embodiment.

In the above manner, it is possible to provide a low-power consumption display device or semiconductor device which allows a high-resolution image of an object to be detected to be taken with little blur even when the object moves fast.

This embodiment can be combined with any of the other embodiments as appropriate.

Embodiment 3

In this embodiment, a modified example of the circuit configuration of the photosensor 106 in FIG. 2 will be described.

Figure 2:
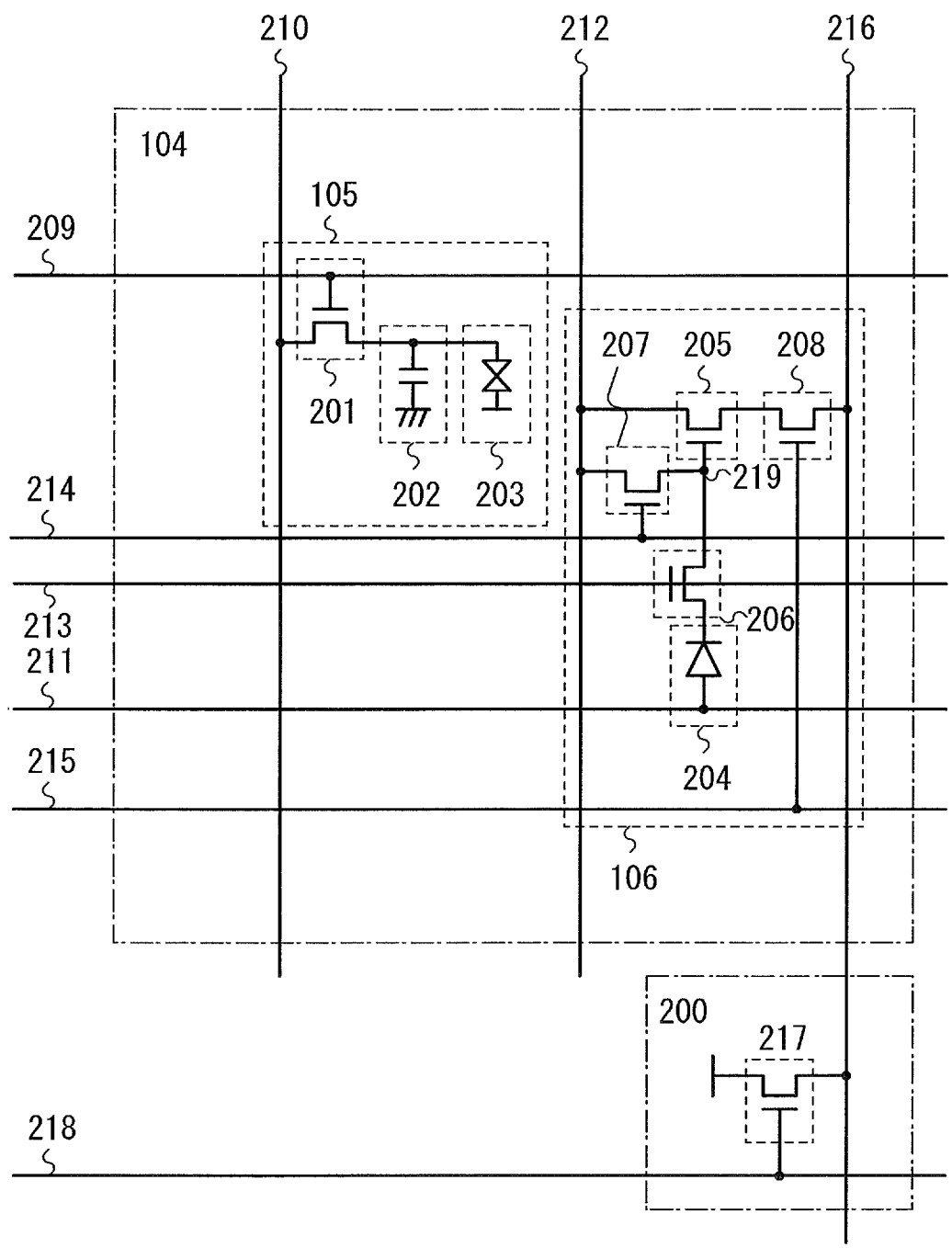
FIG. 2 illustrates an example of a display device according to one embodiment of the present invention.
Figure 3:
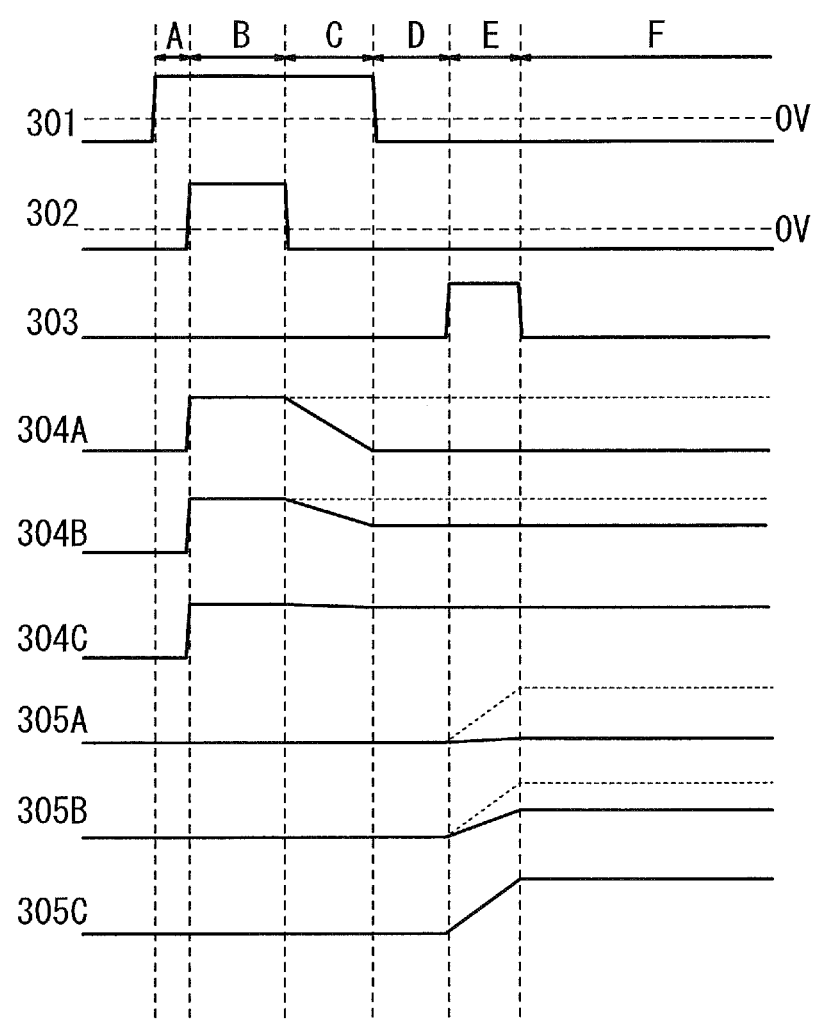
FIG. 3 is a timing chart according to one embodiment of the present invention.
Figure 6A:
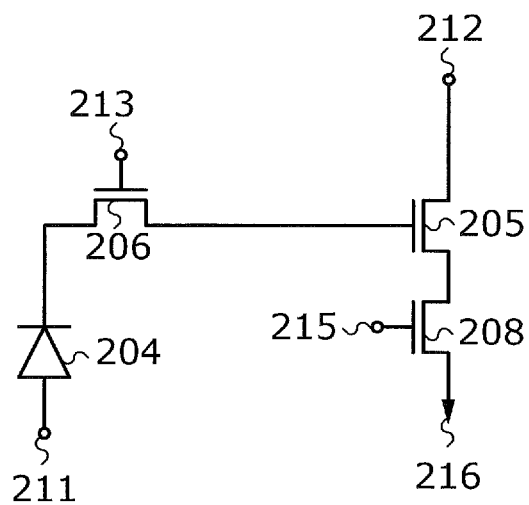
FIGS. 6A to 6C are circuit diagrams each illustrating an example of a photosensor according to one embodiment of the present invention.

FIG. 6A illustrates a configuration in which the transistor 207 for controlling the reset operation of the photosensor, which is connected to the gate of the transistor 205 in FIG. 2, is omitted. In the configuration of FIG. 6A, when the reset operation of the photosensor is performed, the charge accumulated in the gate of the transistor 205 may be discharged by changing the voltage level of the wiring 211.

Figure 6B:
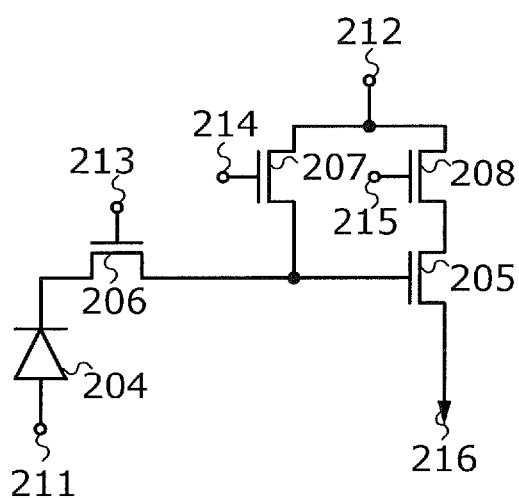

FIG. 6B illustrates a configuration in which the transistor 205 and the transistor 208 are connected in a manner opposite to that in the photosensor 106 in FIG. 2. Specifically, the one of the source and the drain of the transistor 205 is connected to the photosensor output signal line 216, and the one of the source and the drain of the transistor 208 is connected to the photosensor reference signal line 212.

Figure 6C:
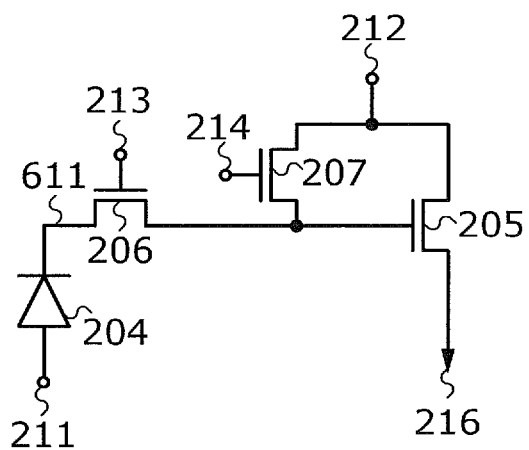

FIG. 6C illustrates a configuration in which the transistor 208 is omitted in the configuration of the photosensor 106 in FIG. 2. The configuration of FIG. 6C is different from those of FIG. 2 and FIGS. 6A and 6B: when the selection operation and the reading operation of the photosensor are performed, a change of the signal corresponding to the charge accumulated in the gate of the transistor 205 may be read by changing the voltage level of the photosensor reference signal line 212.

Figure 10:
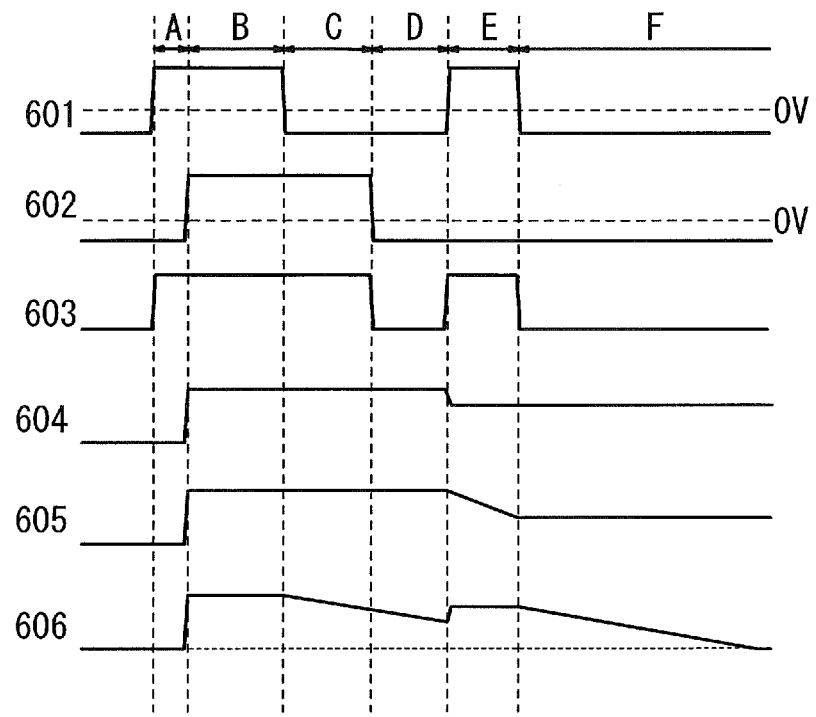
FIG. 10 is a timing chart according to one embodiment of the present invention.

A timing chart relating to the operation of the photosensor 106 illustrated in FIG. 6C is shown in FIG. 10. In FIG. 10, a signal 601, a signal 602, and a signal 603 respectively correspond to the voltage levels of the gate signal line 213, the reset signal line 214, and the photosensor reference signal line 212 in FIG. 6C. A signal 604 corresponds to the voltage level of the gate of the transistor 205 and shows the case where the illuminance of light which enters the photodiode 204 is middle (hereinafter, middle illuminance). A signal 605 shows the voltage level of the photosensor output signal line 216. A signal 606 shows the voltage level of a node 611 in FIG. 6C.

The timing chart of FIG. 10 is described. In a period A, the voltage levels of the signal 601 and the signal 603 are set to "H", and the voltage level of the signal 602 is set to "L2". Then, in a period B, when the voltage level of the signal 602 is set to "H", the voltage level of the signal 604 is reset, and the voltage levels of the signal 605 and the signal 606 are increased. That is, the period A and the period B are a reset operation period. Next, in a period C, when the voltage level of the signal 601 is set to "L2", the voltage level of the signal 606 is decreased. Then, in a period D, the voltage levels of the signal 602 and the signal 603 are set to "L2". That is, the period C and the period D are an accumulation operation period. Next, in a period E, when the voltage levels of the signal 601 and the signal 603 are set to "H", the voltage level of the signal 604 and the voltage level of the signal 606 become the same voltage level, and the voltage level of the signal 605 changes in accordance with an output signal of the photosensor. That is, the period E is a selection operation period. Then, in a period F, the voltage levels of the signal 601 and the signal 603 are set to "L2", and the voltage level of the signal 605 is read. That is, the period F is a reading operation period. In such a manner, the operation of the photosensor 106 illustrated in FIG. 6C may be performed.

This embodiment can be combined with any of the other embodiments as appropriate.

Embodiment 4

Figure 7:
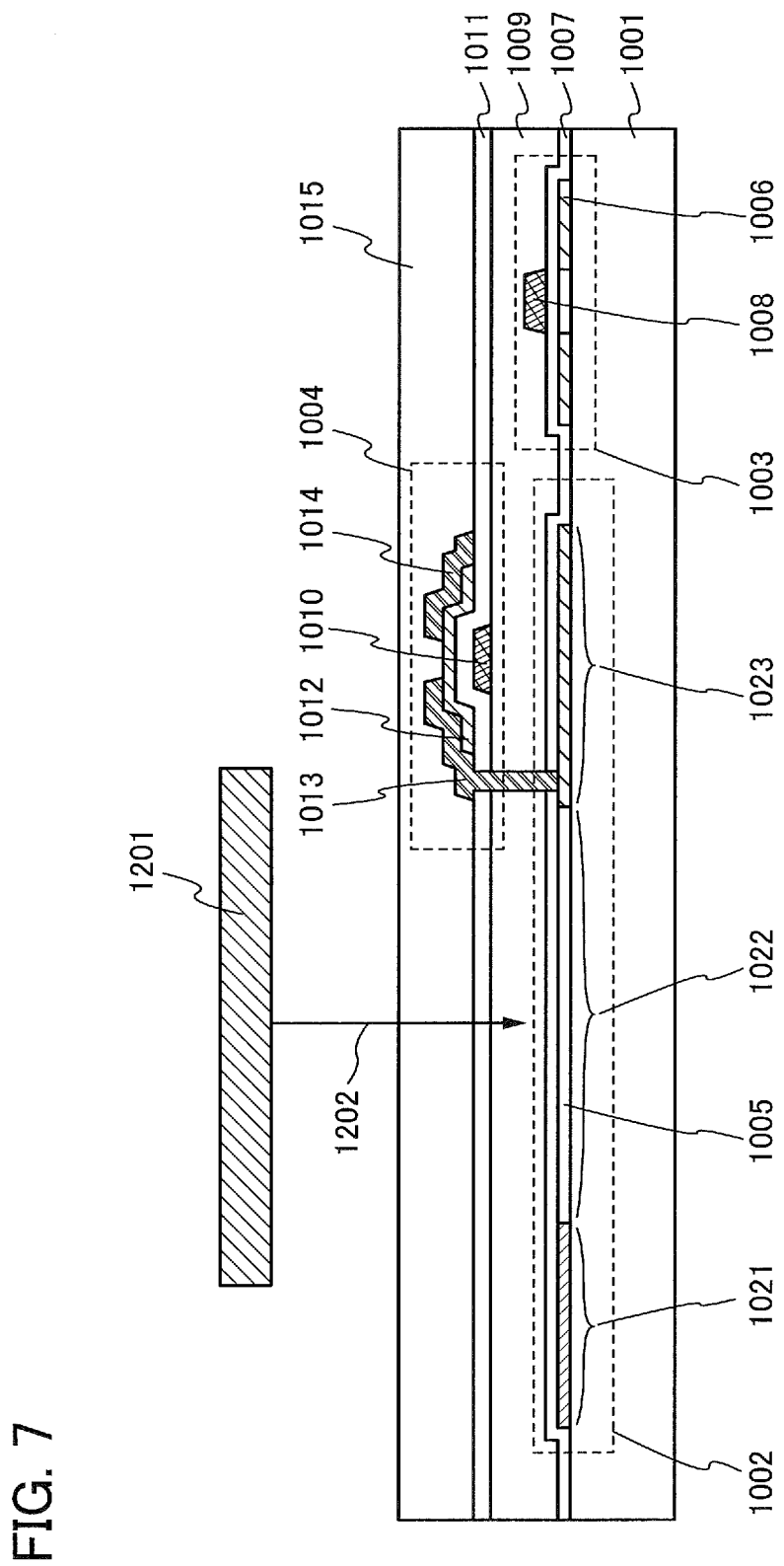
FIG. 7 illustrates an example of a semiconductor device according to one embodiment of the present invention.

In this embodiment, a structure and manufacturing method of a semiconductor device including a photosensor will be described. FIG. 7 is a cross-sectional view of a semiconductor device. Note that the following semiconductor device can be applied to a display device.

In FIG. 7, a photodiode 1002, a transistor 1003, and a transistor 1004 are provided over a substrate 1001 having an insulating surface. The photodiode 1002, the transistor 1003, and the transistor 1004 are respectively cross-sectional views of the photodiode 204, the transistor 205, and the transistor 206 in FIG. 2. Light 1202 emitted from an object to be detected 1201, external light 1202 reflected by the object to be detected 1201, or light 1202 emitted from the inside of the device and reflected by the object to be detected 1201 enters the photodiode 1002. An object to be detected may be provided on the substrate 1001 side.

The substrate 1001 can be an insulating substrate (e.g., a glass substrate or a plastic substrate), the insulating substrate on which an insulating film (e.g., a silicon oxide film or a silicon nitride film) is formed, a semiconductor substrate (e.g., a silicon substrate) on which the insulating film is formed, or a metal substrate (e.g., an aluminum substrate) on which the insulating film is formed.

The photodiode 1002 is a lateral-junction pin diode and includes a semiconductor film 1005. The semiconductor film 1005 includes a region having p-type conductivity (a p-layer 1021), a region having i-type conductivity (an i-layer 1022), and a region having n-type conductivity (an n-layer 1023). Note that the photodiode 1002 may be a pn diode.

The lateral junction pin or pn diode can be formed by adding a p-type impurity and an n-type impurity to predetermined regions of the semiconductor film 1005.

In the photodiode 1002, a single crystal semiconductor (e.g., single crystal silicon) with few crystal defects is preferably used for the semiconductor film 1005 so as to improve the proportion of an electric signal generated from incident light (the quantum efficiency).

The transistor 1003 is a top-gate thin film transistor and includes a semiconductor film 1006, a gate insulating film 1007, and a gate electrode 1008.

The transistor 1003 has a function of converting a charge supplied from the photodiode 1002 into an output signal. Therefore, a single crystal semiconductor (e.g., single crystal silicon) is preferably used for the semiconductor film 1006 to obtain a transistor with high mobility.

An example of forming the semiconductor film 1005 and the semiconductor film 1006 with the use of a single crystal semiconductor will be described. A damaged region is formed at a desired depth of a single crystal semiconductor substrate (e.g., a single crystal silicon substrate) by ion irradiation or the like. The single crystal semiconductor substrate and the substrate 1001 are bonded to each other with an insulating film interposed therebetween; then, the single crystal semiconductor substrate is split along the damaged region, whereby a semiconductor film is formed over the substrate 1001. The semiconductor film is processed (patterned) into a desired shape by etching or the like, so that the semiconductor film 1005 and the semiconductor film 1006 are formed. Since the semiconductor film 1005 and the semiconductor film 1006 can be formed in the same process, cost reduction can be realized. In this manner, the photodiode 1002 and the transistor 1003 can be formed on the same surface.

Note that an amorphous semiconductor, a microcrystal semiconductor, a polycrystalline semiconductor, an oxide semiconductor, or the like can also be used for the semiconductor film 1005 and the semiconductor film 1006. In particular, a single crystal semiconductor is preferably used to obtain a transistor with high mobility. As the semiconductor material, it is preferable to use silicon semiconductor such as silicon or silicon germanium, the crystallinity of which can be easily increased.

Here, the semiconductor film 1005 is preferably made thick in order to improve the quantum efficiency of the photodiode 1002. Further, the semiconductor film 1006 is preferably made thin in order to improve the electrical characteristics such as the S value of the transistor 1003. In that case, the semiconductor film 1005 is only required to be made thicker than the semiconductor film 1006.

A crystal semiconductor is also preferably used for the transistor 208 in FIG. 2 so as to obtain a transistor with high mobility. By using the same semiconductor material as the transistor 1003, the transistor 208 can be formed in the same process as the transistor 1003, resulting in cost reduction.

Note that the gate insulating film 1007 is formed as a single layer or stacked layers using a silicon oxide film, a silicon nitride film, or the like. The gate insulating film 1007 may be formed by plasma CVD or sputtering.

Note that the gate electrode 1008 is formed as a single layer or stacked layers using a metal material such as molybdenum, titanium, chromium, tantalum, tungsten, aluminum, copper, neodymium, or scandium, or an alloy material including any of these materials as a main component. The gate electrode 1008 may be formed by sputtering or vacuum evaporation.

The photodiode 1002 can have a stacked structure of a p-layer, an i-layer, and an n-layer instead of the lateral-junction structure. The transistor 1003 can be a bottom-gate transistor, and can have a channel-stop structure or a channel-etched structure.

Figure 9:
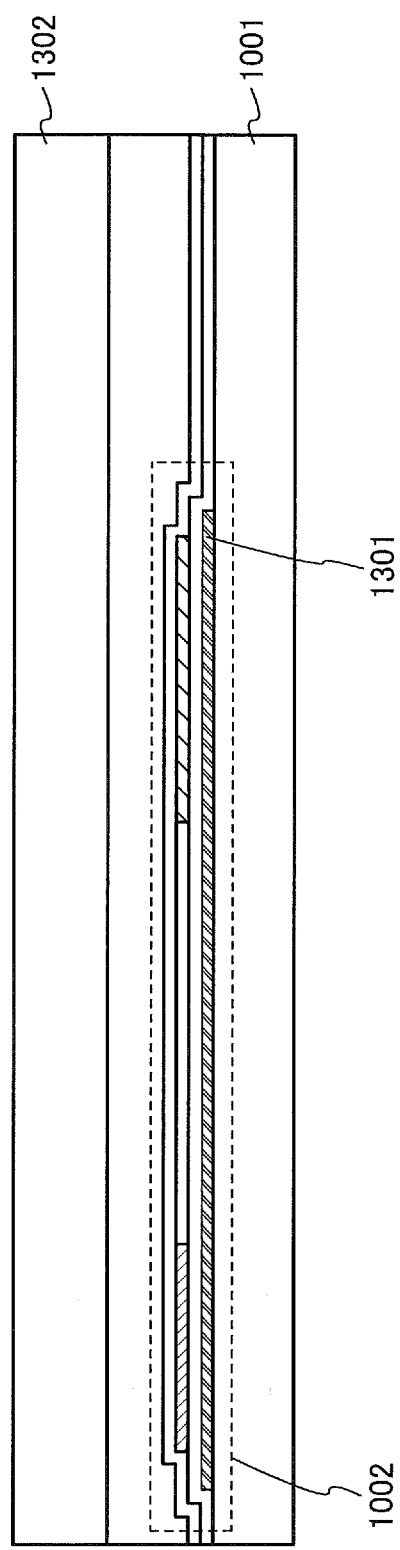
FIG. 9 illustrates an example of a semiconductor device according to one embodiment of the present invention.

Note that as illustrated in FIG. 9, a light-blocking film 1301 may be provided under the photodiode 1002, so that light other than light which should be detected can be blocked. A light-blocking film may be provided over the photodiode 1002. In that case, a light-blocking film can be provided, for example, over a substrate 1302 opposite to the substrate 1001 provided with the photodiode 1002.

The transistor 1004 is a bottom-gate inverted-staggered thin film transistor and includes a gate electrode 1010, a gate insulating film 1011, a semiconductor film 1012, an electrode 1013, and an electrode 1014. An insulating film 1015 is provided over the transistor 1004. Note that the transistor 1004 may be a top-gate transistor.

A feature of the structure is that the transistor 1004 is formed over the photodiode 1002 and the transistor 1003 with an insulating film 1009 interposed therebetween. When the transistor 1004 and the photodiode 1002 are formed on different layers in this manner, the area of the photodiode 1002 can be increased to increase the amount of light received by the photodiode 1002.

Furthermore, part or the whole of the transistor 1004 is preferably formed to overlap with either the n-layer 1023 or the p-layer 1021 of the photodiode 1002. This is because the area of the photodiode 1002 can be increased and the overlapping area of the transistor 1004 and the i-layer 1022 can be made as small as possible so that light can be received efficiently. Also in the case of a pn diode, a smaller overlapping area of the transistor 1004 and a pn junction enables efficient light reception.

The function of the transistor 1004 is to accumulate an output signal of the photodiode 1002 as a charge in the gate of the transistor 1003 and retain the charge. Therefore, an oxide semiconductor is preferably used for the semiconductor film 1012 so that the transistor has an extremely low off-current.

It is also preferable that the transistor 207 in FIG. 2 use an oxide semiconductor to have an extremely low off-current. By using the same semiconductor material as the transistor 1004, the transistor 207 can be formed in the same process as the transistor 1004, resulting in cost reduction. Note that for each of the above semiconductor elements, a thin film semiconductor or a bulk semiconductor may be used.

An example of forming the semiconductor film 1012 using an oxide semiconductor will be shown below.

One of the factors that increase the off-current of a transistor is an impurity such as hydrogen (e.g., hydrogen, water, or a hydroxyl group) contained in an oxide semiconductor. Hydrogen or the like might be a carrier supplier (a donor) in an oxide semiconductor, which causes electric current even in the off state. That is, an oxide semiconductor containing a large amount of hydrogen or the like becomes an n-type oxide semiconductor.

Thus, in the manufacturing method shown below, the amount of hydrogen in an oxide semiconductor is reduced as much as possible and the concentration of oxygen which is a constituent element is increased, whereby the oxide semiconductor is highly purified. The highly-purified oxide semiconductor is an intrinsic or substantially intrinsic semiconductor, resulting in a reduction in off-current.

First, an oxide semiconductor film is formed over the insulating film 1009 by sputtering.

As a target used for forming the oxide semiconductor film, a target of a metal oxide containing zinc oxide as a main component can be used. For example, it is possible to use a target with a composition ratio of $In_2O_3:Ga_2O_3:ZnO=1:1:1$, that is, In:Ga:Zn=1:1:0.5. It is also possible to use a target with a composition ratio of In:Ga:Zn=1:1:1 or a composition ratio of In:Ga:Zn=1:1:2. Further, a target which includes $SiO_2$ at 2 wt % to 10 wt % inclusive can be used.

Note that the oxide semiconductor film may be formed in a rare gas (typically, argon) atmosphere, an oxygen atmosphere, or a mixed atmosphere of a rare gas and oxygen. Here, a sputtering gas used for forming the oxide semiconductor film is a high-purity gas in which impurities such as hydrogen, water, hydroxyl groups, or hydride are reduced to such a level that the concentration thereof can be expressed by ppm, preferably ppb.

The oxide semiconductor film is formed by introducing a sputtering gas from which hydrogen and moisture are removed while removing moisture remaining in a treatment chamber. In order to remove moisture remaining in the treatment chamber, an entrapment vacuum pump is preferably used. For example, a cryopump, an ion pump, or a titanium sublimation pump is preferably used.

The thickness of the oxide semiconductor film may be 2 nm to 200 nm inclusive, preferably 5 nm to 30 nm inclusive. Then, the oxide semiconductor film is processed (patterned) into a desired shape by etching or the like, whereby the semiconductor film 1012 is formed.

Although an In—Ga—Zn—O is used for the oxide semiconductor film in the above example, the following oxide semiconductors can also be used: In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, Zn—O, and the like. The oxide semiconductor film may contain Si. Further, the oxide semiconductor film may be amorphous or crystalline. Further, the oxide semiconductor film may be non-single-crystal or single crystal.

As the oxide semiconductor film, a thin film represented by $InMO_3(ZnO)_m$ (m>0) can also be used. Here, M denotes one or more of metal elements selected from Ga, Al, Mn, and Co. For example, M can be Ga, Ga and Al, Ga and Mn, or Ga and Co.

Next, first heat treatment is performed on the oxide semiconductor film (the semiconductor film 1012). The temperature of the first heat treatment is higher than or equal to 400° C. and lower than or equal to 750° C., preferably higher than or equal to 400° C. and lower than the strain point of the substrate.

Through the first heat treatment, hydrogen, water, hydroxyl groups, and the like can be removed from the oxide semiconductor film (the semiconductor film 1012) (dehydrogenation treatment). The dehydrogenation treatment through the first heat treatment is significantly effective because such impurities become donors in the oxide semiconductor film and increase the off-current of the transistor.

Note that the first heat treatment can be performed with an electric furnace. Alternatively, heat conduction or heat radiation from a heating element such as a resistance heating element may be used for the first heat treatment. In that case, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp.

A GRTA apparatus is an apparatus for heat treatment using a high-temperature gas. As the gas, an inert gas (typically, a rare gas such as argon) or a nitrogen gas can be used. The use of the GRTA apparatus is particularly effective because high-temperature heat treatment in a short time is enabled.

The first heat treatment may be performed before the patterning of the oxide semiconductor film, after the formation of the electrode 1013 and the electrode 1014, or after the formation of the insulating film 1015. However, the first heat treatment is preferably performed before the formation of the electrode 1013 and the electrode 1014 so that the electrodes are not damaged by the first heat treatment.

During the first heat treatment, oxygen deficiencies might be generated in the oxide semiconductor. Therefore, after the first heat treatment, oxygen is preferably introduced to the oxide semiconductor (treatment for supplying oxygen) so that the concentration of oxygen which is a constituent element is increased, whereby the oxide semiconductor is highly purified.

Specifically, as the treatment for supplying oxygen, the first heat treatment is followed by second heat treatment in an oxygen atmosphere or an atmosphere containing nitrogen and/or oxygen (for example, the volume ratio of nitrogen to oxygen is 4 to 1), for example. Alternatively, plasma treatment may be performed in an oxygen atmosphere, so that the oxygen concentration in the oxide semiconductor film can be increased and the oxide semiconductor film can be highly purified. The temperature of the second heat treatment is higher than or equal to 200° C. and lower than or equal to 400° C., preferably higher than or equal to 250° C. and lower than or equal to 350° C.

As another example of the treatment for supplying oxygen, an oxide insulating film (the insulating film 1015) is formed on and in contact with the semiconductor film 1012, and then third heat treatment is performed. Oxygen in the insulating film 1015 moves to the semiconductor film 1012 to increase the oxygen concentration in the oxide semiconductor, whereby the oxide semiconductor film can be highly purified. The temperature of the third heat treatment is higher than or equal to 200° C. and lower than or equal to 400° C., preferably higher than or equal to 250° C. and lower than or equal to 350° C. Note that also in the case of a top-gate transistor, the oxide semiconductor can be highly purified in such a manner that a gate insulating film on and in contact with the semiconductor film 1012 is formed of a silicon oxide film or the like and similar heat treatment is performed.

As described above, the oxide semiconductor film can be highly purified through the treatment for supplying oxygen such as the second heat treatment or the third heat treatment after the dehydrogenation treatment by the first heat treatment. When being highly purified, the oxide semiconductor can be made intrinsic or substantially intrinsic, resulting in a reduction in the off-current of the transistor 1004.

Note that the insulating film 1009 is a single layer or stacked layers using a silicon oxide film, a silicon nitride film, or the like, and is formed over the photodiode 1002 and the transistor 1003. The insulating film 1009 may be formed by plasma CVD or sputtering. The insulating film 1009 may also be formed of a resin film such as a polyimide film by coating or the like.

The gate electrode 1010, which is formed over the insulating film 1009, is formed as a single layer or stacked layers using a metal material such as molybdenum, titanium, chromium, tantalum, tungsten, aluminum, copper, neodymium, or scandium, or an alloy material including any of these materials as a main component. The gate electrode 1010 may be formed by sputtering or vacuum evaporation.

The gate insulating film 1011 is formed as a single layer or stacked layers using a silicon oxide film, a silicon nitride film, or the like. The gate insulating film 1011 may be formed by plasma CVD or sputtering.

The electrode 1013 and the electrode 1014, which are formed over the gate insulating film 1011 and the semiconductor film 1012, each are a single layer or stacked layers using a metal such as molybdenum, titanium, chromium, tantalum, tungsten, aluminum, copper, or yttrium, an alloy material including any of these materials as a main component, or a metal oxide having conductivity such as indium oxide. The electrode 1013 and the electrode 1014 may be formed by sputtering or vacuum evaporation. Here, it is preferable that the electrode 1013 be connected to the n-layer 1023 of the photodiode 1002 through a contact hole formed in the gate insulating film 1007, the insulating film 1009, and the gate insulating film 1011.

The highly-purified oxide semiconductor and a transistor using the same will be described in detail below.

As an example of the highly-purified oxide semiconductor, there is an oxide semiconductor whose carrier concentration is lower than $1\times10^{14}/cm^3$, preferably lower than $1\times10^{12}/cm^3$, and more preferably lower than $1\times10^{11}/cm^3$ or lower than $6.0\times10^{10}/cm^3$.

A transistor using a highly-purified oxide semiconductor is characterized in that the off-current is much lower than that of a transistor including a semiconductor containing silicon, for example.

The following shows the result of measuring the off-current characteristics of a transistor with an evaluation element (also referred to as TEG: Test Element Group). Note that the description is made here on an n-channel transistor.

Figure 8:
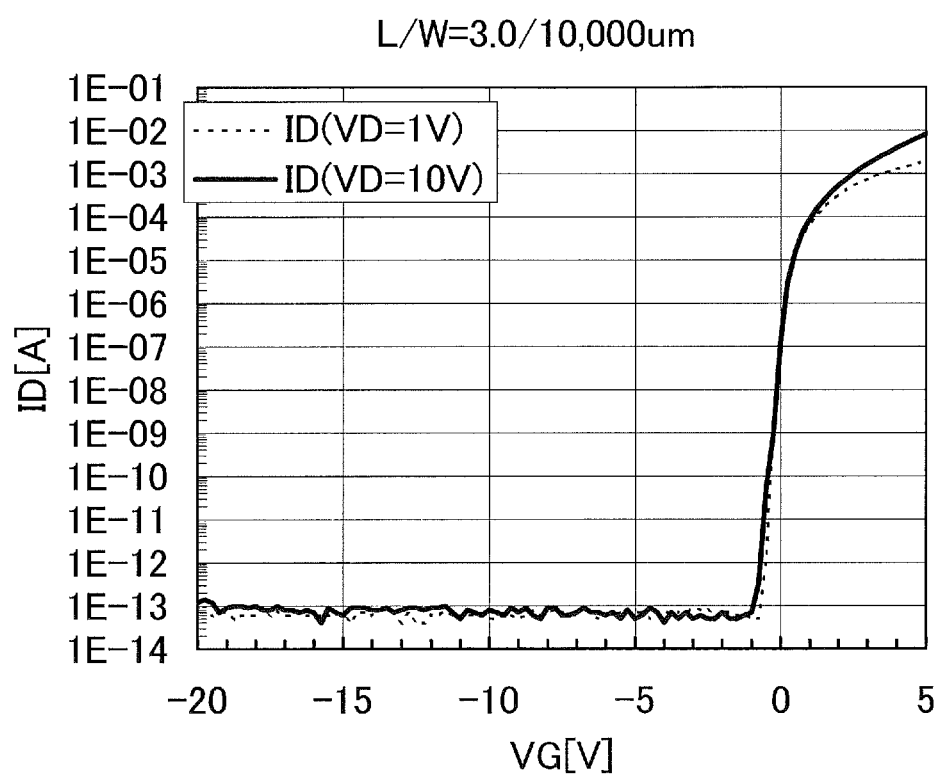
FIG. 8 is a graph showing the electrical characteristics of a transistor.

In the TEG, a transistor with L/W=3 μm/10000 μm, which includes 200 transistors with L/W=3 μm/50 μm (thickness d: 30 nm) connected in parallel, is provided. FIG. 8 illustrates the initial characteristics of the transistor. Here, VG is in the range of −20 V to +5 V inclusive. In order to measure the initial characteristics of the transistor, the characteristics of changes in the source-drain current (hereinafter, referred to as a drain current or ID), i.e., VG-ID characteristics, were measured under the conditions where the substrate temperature was set to room temperature, the voltage between the source and the drain (hereinafter, referred to as a drain voltage or VD) was set to 1 V or 10 V, and the voltage between the source and the gate (hereinafter, referred to as a gate voltage or VG) was changed from −20 V to +20 V.

As illustrated in FIG. 8, the transistor with a channel width W of 10000 μm has an off-current of $1\times10^{-13}$ A or less at VD of 1 V and 10 V, which is less than or equal to the resolution (100 fA) of a measurement device (a semiconductor parameter analyzer, Agilent 4156C manufactured by Agilent Technologies Inc.). The off-current per micrometer of the channel width corresponds to 10 aA/μm.

Note that in this specification, the off-current (also referred to as leakage current) means a current flowing between a source and a drain of an n-channel transistor when a predetermined gate voltage in the range of −20 V to −5 V inclusive is applied at room temperature in the case where the n-channel transistor has a positive threshold voltage $V_{th}$. Note that the room temperature is 15° C. to 25° C. inclusive. A transistor including the oxide semiconductor that is disclosed in this specification has a current per unit channel width (W) of 100 aA/μm or less, preferably 1 aA/μm or less, and more preferably 10 zA/μm or less at room temperature.

Moreover, the transistor including a high-purity oxide semiconductor has favorable temperature characteristics. Typically, in the temperature range of −25° C. to 150° C. inclusive, the current-voltage characteristics of the transistor, such as an on-current, an off-current, field-effect mobility, an S value, and a threshold voltage, hardly change and deteriorate due to temperature.

This embodiment can be combined with any of the other embodiments as appropriate.

This application is based on Japanese Patent Application serial no. 2010-050776 filed with Japan Patent Office on Mar. 8, 2010, the entire contents of which are hereby incorporated by reference.

The invention claimed is:

1. A semiconductor device comprising:
a photosensor comprising:
a first transistor;
a second transistor;
a third transistor; and
a fourth transistor,
wherein a first terminal of the first transistor is electrically connected to a first terminal of the second transistor and a gate of the third transistor,
wherein a first terminal of the third transistor is electrically connected to a first terminal of the fourth transistor, and
wherein a voltage level of a gate of the first transistor is lower than a voltage level of the first terminal of the first transistor and a voltage level of a second terminal of the first transistor, and a voltage level of a gate of the second transistor is lower than a voltage level of the first terminal of the second transistor and a voltage level of a second terminal of the second transistor when a charge corresponding to an amount of incident light to the photosensor and accumulated to the gate of the third transistor is retained by turning off the first transistor and the second transistor.

2. The semiconductor device according to claim 1, wherein the first transistor comprises a channel formation region comprising an oxide semiconductor.

3. The semiconductor device according to claim 1, wherein the second transistor comprises a channel formation region comprising an oxide semiconductor.

4. The semiconductor device according to claim 1, wherein the first transistor comprises a channel formation region comprising an oxide semiconductor, and
wherein the second transistor comprises a channel formation region comprising an oxide semiconductor.

5. The semiconductor device according to claim 1, wherein the charge is discharged from the gate of the third transistor by turning on the second transistor.

6. The semiconductor device according to claim 1, wherein the charge is discharged from the gate of the third transistor by turning on the first transistor and the second transistor.

7. A semiconductor device comprising:
a photosensor comprising:
a first transistor;
a second transistor; and
a third transistor,
wherein a first terminal of the first transistor is electrically connected to a first terminal of the second transistor and a gate of the third transistor, and
wherein a voltage level of a gate of the first transistor is lower than a voltage level of the first terminal of the first transistor and a voltage level of a second terminal of the first transistor, and a voltage level of a gate of the second transistor is lower than a voltage level of the first terminal of the second transistor and a voltage level of a second terminal of the second transistor when a charge corresponding to an amount of incident light to the photosensor and accumulated to the gate of the third transistor is retained by turning off the first transistor and the second transistor.

8. The semiconductor device according to claim 7, wherein the first transistor comprises a channel formation region comprising an oxide semiconductor.

9. The semiconductor device according to claim 7, wherein the second transistor comprises a channel formation region comprising an oxide semiconductor.

10. The semiconductor device according to claim 7,
wherein the first transistor comprises a channel formation region comprising an oxide semiconductor, and
wherein the second transistor comprises a channel formation region comprising an oxide semiconductor.

11. The semiconductor device according to claim 7,
wherein the charge is discharged from the gate of the third transistor by turning on the second transistor.

12. The semiconductor device according to claim 7,
wherein the charge is discharged from the gate of the third transistor by turning on the first transistor and the second transistor.

13. A semiconductor device comprising:
a photosensor comprising:
a first transistor; and
a second transistor;
wherein a first terminal of the first transistor is electrically connected to a gate of the second transistor,
wherein a voltage level of a gate of the first transistor is lower than a voltage level of the first terminal of the first transistor and a voltage level of a second terminal of the first transistor when a charge corresponding to an amount of incident light to the photosensor and accumulated to the gate of the second transistor is retained by turning off the first transistor.

14. The semiconductor device according to claim 13,
wherein the first transistor comprises a channel formation region comprising an oxide semiconductor.

15. The semiconductor device according to claim 13,
wherein the second transistor comprises a channel formation region comprising an oxide semiconductor.

16. The semiconductor device according to claim 13,
wherein the first transistor comprises a channel formation region comprising an oxide semiconductor, and
wherein the second transistor comprises a channel formation region comprising an oxide semiconductor.

17. The semiconductor device according to claim 13,
wherein the charge is discharged from the gate of the second transistor by turning on the first transistor.

* * * * *